United States Patent
Guarniero et al.

[11] Patent Number: 6,039,807
[45] Date of Patent: Mar. 21, 2000

[54] APPARATUS FOR MOVING EXHAUST TUBE OF BARREL REACTOR

[75] Inventors: Umberto Guarniero, Novara; Franco Magon, Trecate; Enzo Bonanno, Novara, all of Italy

[73] Assignee: MEMC Electronic Materials, Inc., St. Peters, Mo.

[21] Appl. No.: 09/040,123

[22] Filed: Mar. 17, 1998

[51] Int. Cl.[7] .................................................... C23C 16/00
[52] U.S. Cl. .............................. 118/715; 74/110; 118/50; 432/241; 432/245
[58] Field of Search ........................ 118/50, 715; 74/110; 432/241, 245

[56] References Cited

U.S. PATENT DOCUMENTS

| | | | |
|---|---|---|---|
| 4,179,884 | 12/1979 | Koeslin | 60/321 |
| 4,928,626 | 5/1990 | Carloson et al. | |
| 5,053,247 | 10/1991 | Moore | |
| 5,154,773 | 10/1992 | Furusawa | |
| 5,407,349 | 4/1995 | Hansotte, Jr. et al. | |
| 5,578,132 | 11/1996 | Yamaga et al. | |

OTHER PUBLICATIONS

Abstract of Japan 8–236,463 (Published Sep. 13, 1996).

*Primary Examiner*—Leo B. Tentoni
*Attorney, Agent, or Firm*—Senniger, Powers, Leavitt & Roedel

[57] ABSTRACT

An epitaxial barrel reactor for depositing a material on a semiconductor wafer by a chemical vapor deposition process using a reactant gas. The barrel reactor includes a receptacle defining a reaction chamber sized to receive at least one semiconductor wafer. The receptacle has an inlet port for introducing reactant gas to the reaction chamber and an exhaust port for removing reactant gas from the reaction chamber. The reactor also includes an exhaust tube sealingly engageable with the exhaust port of the receptacle for transporting reactant gas to facility piping to remove the gas from the reaction chamber after the chemical vapor deposition process. In addition, the reactor includes an actuator spaced from the receptacle for moving the exhaust tube between an operating position in which the tube sealingly engages the exhaust port of the receptacle and a maintenance position in which the tube is spaced from the exhaust port to provide access to the receptacle. Further, the reactor includes a mechanism operatively connected between the exhaust tube and the actuator for transmitting motion from the actuator to the exhaust tube to move the tube between the operating position and the maintenance position.

18 Claims, 4 Drawing Sheets

6,039,807

APPARATUS FOR MOVING EXHAUST TUBE OF BARREL REACTOR

BACKGROUND OF THE INVENTION

The present invention relates generally to barrel reactors and more particularly to apparatus for moving an exhaust tube of a barrel reactor between an operating position and a maintenance position.

Barrel reactors, such as generally indicated by the reference numeral 10 in FIG. 1, are used to deposit epitaxial layers on semiconductor wafers by a process known as chemical vapor deposition. The epitaxial layers have lattice structures which are identical to those of the wafers, but may be grown so they have different conductivity than the wafers to obtain necessary electrical properties. As illustrated in FIG. 2, the barrel reactor 10 comprises a reaction chamber 12 constructed from an inverted bell jar 14 for containing wafers W. A gas ring 30 sits atop an upper opening 16 of the bell jar 14. Nozzles 32 are provided in the gas ring 30 for introducing a reactant gas (e.g., silicon) into the reaction chamber 12. This gas forms the epitaxial layer on the wafers W contained in the chamber 12. After deposition is complete, the reactant gas is purged from the reaction chamber 12 through an exhaust tube, generally designated by 50' in FIG. 1, at the bottom of the bell jar 14. (Prime symbols are used with reference numbers herein to indicate that the designated component differs from the present invention.) The exhaust tube 50' includes an exhaust cup 52', flexible tubing 54 connected to the cup and rigid facility piping 56. Once purged, a seal plate 36 mounted on the gas ring 30 may be lifted to open the reaction chamber 12 to remove the wafers W from the barrel reactor 10.

Not only does material deposit on the wafers W contained in the reaction chamber 12, but it also deposits on the various components of the barrel reactor 10 during the chemical vapor deposition process. These deposits can become dislodged from the components and contaminate wafers during subsequent deposition operations. Consequently, the barrel reactor components must be replaced periodically to avoid contaminating wafers. Since the reactors 10 must be removed from service when the components are replaced, it is beneficial to reduce the time during which the reactors are out of service to reduce production costs associated with downtime.

In the past, apparatus such as that generally designated 150' in FIG. 1 has been used to move the exhaust tube 50', and more particularly the cup 52', between an operating position in which it is tightly sealed against an exhaust port 18 (FIG. 3) of the bell jar 14 and a maintenance position in which the exhaust tube is spaced from the exhaust port of the bell jar. Separating the exhaust cup 52' from the bell jar 14 permits the bell jar and/or portions of the exhaust tube to be replaced or serviced. The prior apparatus 150' comprises a cylinder, generally designated 90', positioned directly below the bell jar 14 and exhaust tube 50'. The cylinder 90' is connected to the exhaust tube 50' so that the exhaust tube seats against the bell jar exhaust port 18 when the cylinder is extended and separates from the exhaust port when the cylinder is retracted. As shown in FIG. 1, flexible tubing 54 is connected between the exhaust tube and facility exhaust piping 56 to permit the exhaust tube to move easily between the operating position and the maintenance position.

Prior apparatus 150' such as that described above are prone to failure due to the high temperature environment in which they are used. In particular, seals (not shown) in the cylinders 90' tend to fail when exposed to heat emitted by the bell jar 14 during chemical vapor deposition. Further, the prior exhaust cups 52' tend to fail in a region around their upper flanges 68'. This region has reduced material strength because the flange 68' is welded to the tube. Moreover, O-ring seals (not shown) used to seal the interface between the flange 68' and the bell jar 14 fail when exposed to high temperatures.

SUMMARY OF THE INVENTION

Among the several objects of the present invention may be noted the provision of improved apparatus for moving an exhaust tube of a barrel reactor between an operating position and a maintenance position; the provision of such apparatus which reduces the downtime necessary to replace barrel reactor receptacles; and the provision of such apparatus which is resistant to heat produced by the barrel reactor.

Briefly, apparatus of this invention is an epitaxial barrel reactor for depositing a material on a semiconductor wafer by a chemical vapor deposition process using a reactant gas. The barrel reactor includes a receptacle defining a reaction chamber sized to receive at least one semiconductor wafer. The receptacle has an inlet port for introducing reactant gas to the reaction chamber and an exhaust port for removing reactant gas from the reaction chamber. The reactor also includes an exhaust tube sealingly engageable with the exhaust port of the receptacle for transporting reactant gas to facility piping to remove the gas from the reaction chamber after the chemical vapor deposition process. In addition, the reactor includes an actuator spaced from the receptacle for moving the exhaust tube between an operating position in which the tube sealingly engages the exhaust port of the receptacle and a maintenance position in which the tube is spaced from the exhaust port to provide access to the receptacle. Further, the reactor includes a mechanism operatively connected between the exhaust tube and the actuator for transmitting motion from the actuator to the exhaust tube to move the tube between the operating position and the maintenance position.

In another aspect, apparatus of this invention is for use with an epitaxial barrel reactor to move an exhaust tube between an operating position and a maintenance position. The apparatus comprises an actuator spaced from the reactor for moving the exhaust tube between the operating position and the maintenance position. Further, the apparatus includes a mechanism operatively connected between the exhaust tube and the actuator for transmitting motion from the actuator to the tube to move the tube between the operating position and the maintenance position.

In yet another aspect, the present invention includes an exhaust tube for transporting reactant gas from an epitaxial barrel reactor. The tube comprises a tubular shell having an inlet and an outlet and a flange adjacent the inlet sized and shaped for connecting the tube to an outlet port of the barrel reactor. The tube also comprises a water-tight jacket surrounding the tube. The jacket and tube define an annular cooling passage extending at least partially along the tube for circulating cooling water around the tube to cool the tube during chemical vapor deposition.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
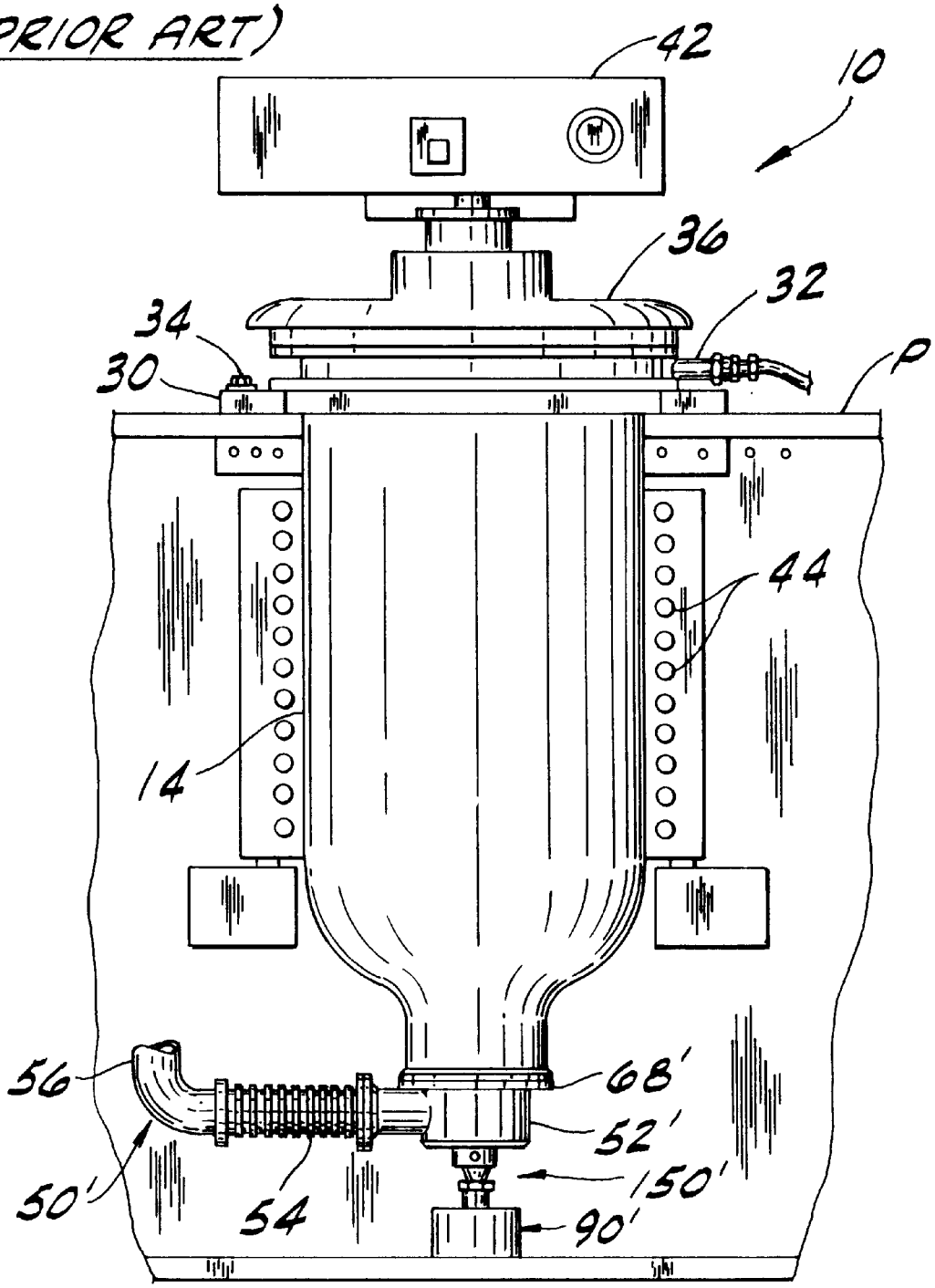
FIG. 1 is a fragmentary front elevation of a prior art barrel reactor.
Figure 2:
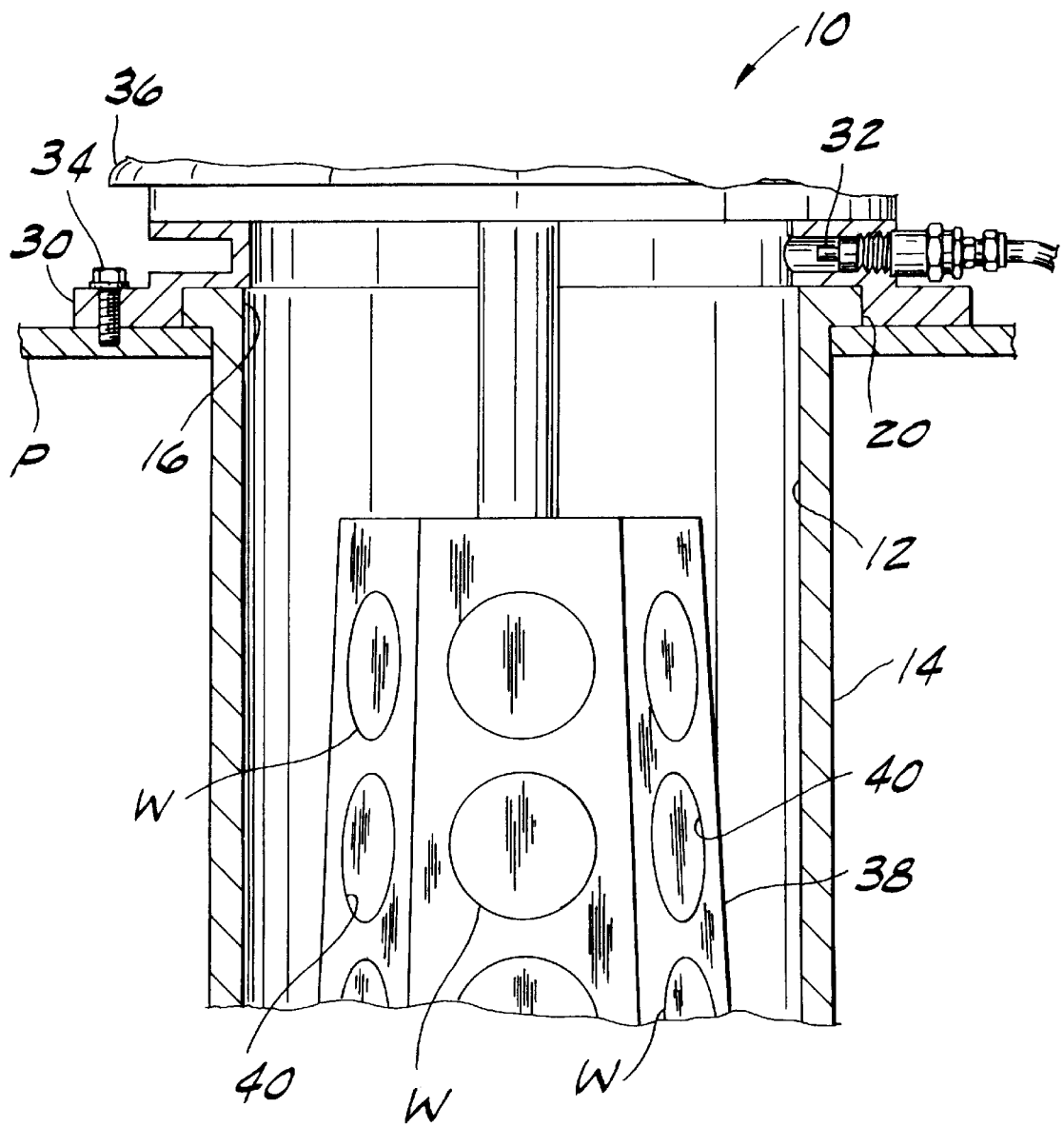
FIG. 2 is a fragmentary cross section of the barrel reactor showing interior features common to both the prior art reactor and the reactor of the present invention.

Referring now to the drawings and in particular to FIG. 1, a conventional epitaxial barrel reactor is designated in its entirety by the reference numeral 10. Such barrel reactors 10 are used to deposit epitaxial layers on semiconductor wafers by a process known as chemical vapor deposition. As illustrated in FIG. 2, the barrel reactor 10 comprises a reaction chamber 12 constructed from a receptacle such as an inverted bell jar 14 for containing wafers W. The bell jar 14 includes an upper opening 16 for inserting and removing wafers W and an exhaust port 18 (FIG. 3) at the bottom of the bell jar for purging reactant gases from the reaction chamber 12 after deposition is complete. A rim 20 is provided around the upper end of the bell jar 14 for supporting the bell jar when it is installed in a work station platform P as shown in FIG. 1.

As further illustrated in FIG. 2, a gas ring 30 is mounted on top of the bell jar 14 above its upper opening 16. Two nozzles 32 (only one of which is shown) are provided in the gas ring 30 for introducing a reactant gas (e.g., silicon) into the reaction chamber 12. This gas forms the epitaxial layer on the wafers W contained in the chamber 12. The gas ring 30 is held in place by screw fasteners 34 (only one of which is shown) which are fastened to the platform P. Thus, the gas ring 30 acts as a clamp for holding the rim 20 of the bell jar 14 against the work station platform P.

A seal plate 36 is mounted on the gas ring 30 to seal the top of the reaction chamber 12. The seal plate 36 may be lifted to open the reaction chamber 12 to remove the wafers W from the barrel reactor 10. A pentagonal susceptor 38 suspended from the seal plate 36 includes circular recesses 40 for holding the wafers W in a generally vertical orientation so one face of each wafer is exposed to gases in the reaction chamber 12. The susceptor 38 may be lifted out of the reaction chamber 12 to permit the wafers W to be removed from the recesses 40 once the deposition is complete. A controller 42 (FIG. 1) and motor (not shown) positioned above the seal plate 36 spin the susceptor 38 about its vertical axis to evenly distribute the epitaxial layer on the wafers W as is well known in the art. A cooling jacket 44 surrounds the bell jar 14 for cooling the jar and associated equipment.

Figure 3:
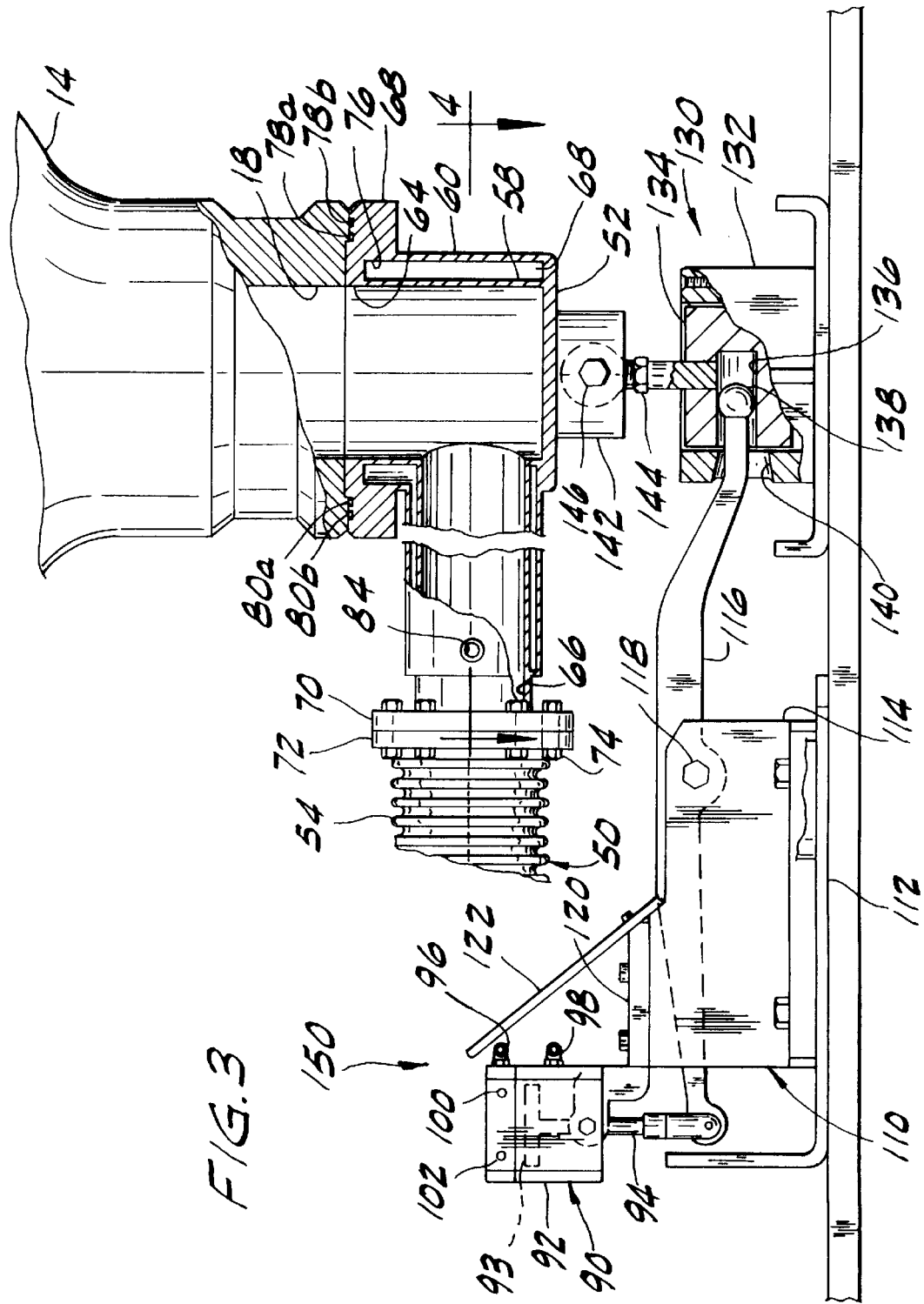
FIG. 3 is a fragmentary front elevation in partial section showing an exhaust tube of the barrel reactor and an apparatus of this invention for moving the exhaust tube between an operating position and a maintenance position.

After deposition is complete, the reactant gas is purged from the reaction chamber 12 through an exhaust tube, generally designated by 50 in FIG. 3, extending from the exhaust port 18 at the bottom of the bell jar 14. The exhaust tube 50 comprises an exhaust cup 52, flexible tubing 54 connected to the cup and conventional facility piping 56 (FIG. 1) connected to the flexible tubing for venting reactant gases from the facility. As illustrated in FIG. 3, the exhaust cup 52 includes a tubular inner shell 58 for transporting the reactant gases and a watertight cooling jacket 60 surrounding the shell. The jacket 60 and shell 58 define an annular passage 62 extending along the exhaust cup 52 for circulating cooling water around the cup. The inner shell 58 has a gas inlet 64 at its upstream end and a gas outlet 66 at its downstream end. A first flange 68 is provided at the inlet 64 for sealably connecting the exhaust cup 52 to the exhaust port 18 of the bell jar 14. A second flange 70 at the outlet 66 of the shell 58 connects the exhaust cup 52 to the flexible tubing 54. A similar flange 72 is provided on the flexible tubing 54 for connecting the cup 52 and tubing with screw fasteners 74. Although screw fasteners 74 are used to connect the exhaust cup 52 to the flexible tubing 54 in the preferred embodiment, other connection means such as a strap clamp (not shown) are also envisioned as being within the scope of the present invention.

Figure 4:
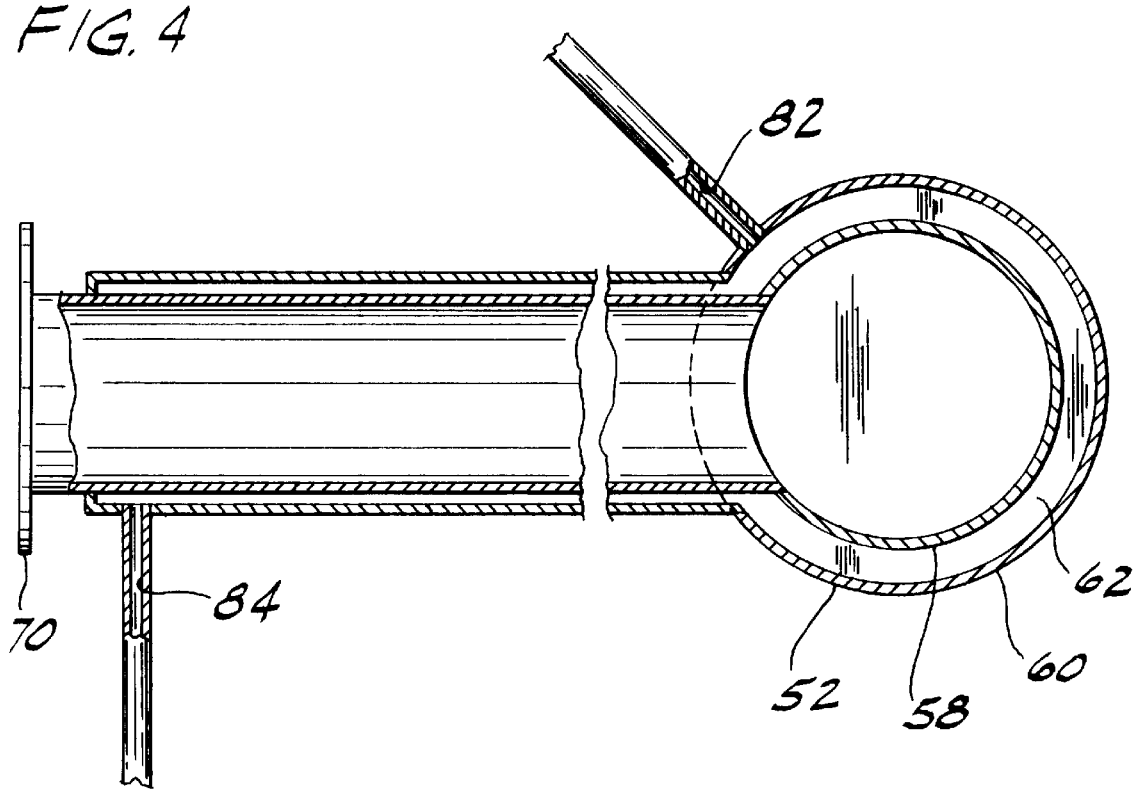
FIG. 4 is a cross section of the exhaust tube taken in the plane of line 4—4 in FIG. 3.

As shown in FIG. 3, the jacket 60 abuts the first flange 68 which includes an annular recess 76 extending upward into the flange from the annular cooling passage 62. The recess 76 circulates water through the flange for cooling. Cooling the flange 68 increases the life of the exhaust cup 52 in the region of the flange which was susceptible to cracking in prior art designs. Two O-ring seal grooves 78a, 78b are formed in the upper face of the first flange 66 for holding O-rings 80a, 80b to seal the interface between bell jar 14 and exhaust cup 52 when the first flange is pressed upward against the exhaust port 18 of the bell jar. A vacuum may be drawn between the O-rings 80a, 80b through a vacuum passage (not shown) to further seal the first flange 68 against the exhaust port 18 of the bell jar 14. Cooling water circulating through the annular cooling passage 62 in the first flange 68 also reduces the temperatures of the O-rings 80a, 80b which prolongs their lives. As illustrated in FIG. 4, an inlet passage 82 delivers cooling water to the annular passage 62 and an outlet passage 84 at an opposite end of the annular passage permits water to exit from the annular passage to remove heat from the exhaust cup 52 during chemical vapor deposition.

As illustrated in FIG. 3, a gas-operated actuator, generally designated 90, moves the exhaust tube 50 between an operating position in which the first flange 68 of the exhaust cup 52 sealingly engages the exhaust port 18 of the bell jar 14 and a maintenance position in which the first flange is separated from the exhaust port for servicing the exhaust tube and the bell jar. The actuator 90 comprises a cylinder body 92 and a piston 93 connected to a piston rod 94 slidably received in the body so the rod moves between an extended position and a retracted position corresponding to the operating and maintenance positions of the exhaust cup, respectively. In addition, the actuator has a head end pressure port 96 and a rod end pressure port 98 through which pressurized gas (e.g., nitrogen) is introduced for moving the piston rod 94 with respect to the cylinder body 92 between the extended and retracted positions, respectively. A cooling water inlet and outlet 100, 102, respectively, permit cooling water to be circulated through an internal cooling passage (not shown) in the cylinder body 98 to cool the actuator 90. To further reduce the temperature of the actuator 90, it is physically spaced from the bell jar 14.

A mechanism, generally designated 110, operatively connects the exhaust tube 50 and the actuator 90 for transmitting motion from the actuator to the exhaust tube to move the tube between the operating and maintenance positions. The mechanism 110 includes a base 112 having two vertical parallel plates 114 (only one of which is shown) and a lever 116 positioned between the plates. The lever 116 is pivotally connected to the plates 114 with a bolt 118.

One end of the lever 116 is pivotally connected to the rod 96 of the actuator 90. The cylinder body 98 is pivotably attached to a bracket 120 connected across the top of the plates 114 so the actuator 90 is free to pivot as the rod 96 moves in and out of the cylinder body. Because the actuator 90 is free to pivot with respect to both the base 112 and the lever 116, bending forces in the rod 96 are avoided. A heat shield 122 attached to the bracket 118 is positioned between the bell jar 14 and the actuator 90 for reflecting heat away from the actuator and thereby preventing damage to the actuator.

The end of the lever 116 opposite the actuator 90 is attached to a slider assembly, generally designated 130. The slider assembly 130 comprises a hollow guide 132 and a cylindrical follower 134 slidably received within the guide. The follower 134 slides up and down in the guide 132 as the piston rod 94 moves between its extended and retracted positions, respectively. The follower 134 has a circular hole 136 extending inward from one side. A ball 138 mounted on the end of the lever 116 attached to the slider assembly 130 is received in the hole 136 so the follower 134 slides freely up and down in the guide 132 as the actuator 90 pivots the lever. A slot 140 formed in the side of the guide 132 provides clearance for permitting the lever 116 to travel up and down. A clevis 142 extending from the bottom of the exhaust cup 52 receives an eye 144 attached to the top of the follower 134. The clevis 142 and eye 144 are pivotally joined by a bolt 146. Together the mechanism 110 and the actuator 90 form an apparatus, generally designated 150 for raising and lowering the exhaust tube 50 in response to the actuator rod 94 moving between the extended and retracted positions.

Under normal operating conditions, the head end pressure port 96 of the actuator 90 is pressurized to extend the rod 94. With the rod 94 extended, the lever 116 is pivoted to the position shown in FIG. 3 in which the first flange 68 of the exhaust cup 52 is pressed upward against exhaust port 18 of the bell jar 14 to seal the corresponding interface between the cup and port. Periodically, when deposits form in the exhaust tube 50 and bell jar 14, the rod end pressure port 98 of the actuator 90 is pressurized to retract the rod 94. As the rod retracts, the lever 116 pivots (clockwise as shown in FIG. 3) to separate the exhaust cup 52 from the exhaust port 18 of the bell jar 14. Once separated, the bell jar 14 and/or the exhaust tube 50 may be serviced.

As will be apparent to those skilled in the art, when the actuator 90 presses the cup upward against the bell jar 14, the bell jar rim 20 is pushed upward against the gas ring 30 which tensions the screw fasteners 34 holding the ring against the platform P. Lowering the exhaust cup 52 relieves the tension so that the fasteners may be unscrewed when the bell jar 14 is being replaced.

As previously explained, prior apparatus 150' for raising and lowering the exhaust cup 52' are prone to failure due to the high temperature environment in which they are used. In particular, the actuators 90' fail because seals (not shown) inside the actuators fail when exposed to heat emitted by the bell jar 14 during chemical vapor deposition. As explained above, the apparatus of the present invention overcomes this problem by increasing the distance between the bell jar 14 and the actuator 90, by shielding the actuator with a heat shield 122, and by circulating cooling water through the actuator. Further, the upper flanges 68' of prior exhaust cups 52' and the seals between the flanges and the bell jars 14 fail due to the high temperature environment. As explained above, the exhaust tube 50, and more particularly, the exhaust cup 52 of the present invention are water cooled to prolong the life of the exhaust tube and seals 80a, 80b.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. An epitaxial barrel reactor for depositing a material on a semiconductor wafer by a chemical vapor deposition process using a reactant gas, said barrel reactor comprising:
    a receptacle defining a reaction chamber sized to receive at least one semiconductor wafer, said receptacle having an inlet port for introducing reactant gas to said reaction chamber and an exhaust port for removing reactant gas from said reaction chamber;
    an exhaust tube sealingly engageable with the exhaust port of the receptacle for transporting reactant gas to facility piping to remove said gas from the reaction chamber after the chemical vapor deposition process;
    an actuator spaced from the receptacle for moving the exhaust tube between an operating position in which the tube sealingly engages the exhaust port of the receptacle and a maintenance position in which the tube is spaced from the exhaust port to provide access to the receptacle; and
    a mechanism operatively connected between the exhaust tube and the actuator for transmitting motion from the actuator to the exhaust tube to move the tube between said operating position and said maintenance position.

2. A barrel reactor as set forth in claim 1 further comprising a heat shield positioned between the receptacle and the actuator for preventing heat transfer from the receptacle to the actuator.

3. A barrel reactor as set forth in claim 1 wherein the actuator is a water cooled actuator having cooling passages for transmitting cooling water through the actuator to remove heat from the actuator.

4. A barrel reactor as set forth in claim 1 wherein the mechanism comprises a base and a lever pivotally connected to the base, the lever extending between the actuator and the exhaust tube for transmitting motion from the actuator to the exhaust tube.

5. A barrel reactor as set forth in claim 4 wherein the actuator is pivotally connected to the base and to the lever.

6. A barrel reactor as set forth in claim 4 wherein the lever and the exhaust tube are pivotally connected.

7. A barrel reactor as set forth in claim 1 wherein the actuator is a gas-operated actuator comprising a cylinder body and a piston slidably received within the cylinder body, said piston moving with respect to the 5 cylinder body between an extended position and a retracted position in response to fluid entering and exiting the cylinder body.

8. A barrel reactor as set forth in claim 7 wherein the mechanism is adapted to move the exhaust tube to said operating position when the piston moves to said extended position and the mechanism is adapted to move the exhaust tube to said maintenance position when the piston moves to said retracted position.

9. Apparatus for use with an epitaxial barrel reactor to move an exhaust tube therefor between an operating position in which the tube engages an exhaust port of the reactor for transporting reactant gas from the reactor after chemical vapor deposition is complete and a maintenance position in which the tube is spaced from the reactor to provide access to the reactor, said apparatus comprising:
    an actuator spaced from the reactor for moving the exhaust tube between said operating position and said maintenance position; and a mechanism operatively connected between the exhaust tube and the actuator for transmitting motion from the actuator to the tube to move the tube between said operating position and said maintenance position.

10. Apparatus as set forth in claim 9 further comprising a heat shield positioned between the reactor and the actuator for preventing heat transfer from the reactor to the actuator.

11. Apparatus as set forth in claim 9 wherein the actuator is a water cooled actuator having cooling passages for transmitting cooling water through the actuator to remove heat from the actuator.

12. Apparatus as set forth in claim 9 wherein the mechanism comprises a base and a lever pivotally connected to the base, the lever extending between the actuator and the tube for transmitting motion from the actuator to the exhaust tube.

13. Apparatus as set forth in claim 12 wherein the actuator is pivotally connected to the base and to the lever.

14. Apparatus as set forth in claim 12 wherein the lever and the exhaust tube are pivotally connected.

15. Apparatus as set forth in claim 9 wherein the actuator is a gas-operated actuator comprising a cylinder body and a piston slidably received within the cylinder body, said piston moving with respect to the 5 cylinder body between an extended position and a retracted position in response to fluid entering and exiting the cylinder.

16. Apparatus as set forth in claim 15 wherein the mechanism is adapted to move the exhaust tube to said operating position when the piston moves to said extended position and the mechanism is adapted to move the exhaust tube to said maintenance position when the piston moves to said retracted position.

17. An epitaxial barrel reactor for depositing a material on a semiconductor wafer by a chemical vapor deposition process using a reactant gas, said barrel reactor comprising:

a receptacle defining a reaction chamber sized to receive at least one semiconductor wafer, said receptacle having an inlet port for introducing reactant gas to said reaction chamber and an exhaust port for removing reactant gas from said reaction chamber;

an exhaust tube having a tubular shell sealingly engageable with the exhaust port of the receptacle for transporting reactant gas to facility piping to remove said gas from the reaction chamber after the chemical vapor deposition process and a water-tight jacket surrounding the shell, the jacket and shell defining an annular cooling passage extending at least partially along the tube for circulating cooling water around the shell to cool the shell during chemical vapor deposition; and an actuator operatively connected to the exhaust tube for moving the exhaust tube between an operating position in which the tube sealingly engages the exhaust port of the receptacle and a maintenance position in which the tube is spaced from the exhaust port to provide access to the receptacle.

18. An epitaxial barrel reactor as set forth in claim 17 wherein the exhaust tube further comprises a flange extending from the shell for sealingly engaging the exhaust port of the receptacle, the flange including a recess extending into the flange from the annular cooling passage for circulating cooling water around the flange to cool the flange during chemical vapor deposition.

* * * * *

UNITED STATES PATENT AND TRADEMARK OFFICE
CERTIFICATE OF CORRECTION

PATENT NO. : 6,039,807
DATED : March 21, 2000
INVENTOR(S) : Umberto Guarniero, Franco Magon, Enzo Bonanno It is certified that error appears in the above-identified patent and that said Letters Patent is hereby corrected as shown below:

In column 7, claim 15, line 24 "the 5 cylinder body" should read -- the cylinder body --.

Signed and Sealed this

Twenty-ninth Day of May, 2001

Attest:

NICHOLAS P. GODICI

*Attesting Officer*    Acting Director of the United States Patent and Trademark Office